(12) United States Patent
Terakado et al.

(10) Patent No.: US 6,439,496 B2
(45) Date of Patent: Aug. 27, 2002

(54) SPOOL HOLDER STRUCTURE FOR A WIRE BONDER

(75) Inventors: Yoshimitsu Terakado, Hachioji; Takatoshi Kawamura, Akishima; Tadashi Akiike, Kokubunji, all of (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 1 day.

(21) Appl. No.: 09/725,669

(22) Filed: Nov. 29, 2000

(30) Foreign Application Priority Data

Nov. 29, 1999 (JP) .................................. 11-337286

(51) Int. Cl.[7] ................... B65H 75/44; B65H 75/18; B65H 49/26
(52) U.S. Cl. ................... 242/390.8; 242/486.8; 242/597.4
(58) Field of Search ................... 242/390.8, 390.9, 242/597.4, 486.8

(56) References Cited

U.S. PATENT DOCUMENTS

| | | | | |
|---|---|---|---|---|
| 3,258,545 A | * | 6/1966 | Bernard, Jr. | 191/12.2 R |
| 4,584,442 A | * | 4/1986 | Shields | 191/12.2 R |
| 4,763,826 A | * | 8/1988 | Kulicke, Jr. et al. | 228/4.5 |
| 5,318,234 A | * | 6/1994 | Biggs et al. | 242/420.6 |
| 5,468,927 A | * | 11/1995 | Terakado | 219/56.21 |
| 5,564,616 A | * | 10/1996 | Torihata et al. | 228/4.5 |
| 5,775,567 A | * | 7/1998 | Lo et al. | 228/1.1 |
| 5,791,550 A | * | 8/1998 | Kobayashi | 228/180.5 |

FOREIGN PATENT DOCUMENTS

| | | | | |
|---|---|---|---|---|
| JP | 5-211199 | * | 8/1993 | 28/904 X |
| JP | 2550162 | | 6/1997 | |

* cited by examiner

Primary Examiner—Michael R. Mansen
Assistant Examiner—Minh-Chau Pham
(74) Attorney, Agent, or Firm—Koda & Androlia

(57) ABSTRACT

A spool holder structure used in, for instance, a bonding apparatus and equipped with a spool holder that holds a spool around which a wire is wound, a holder shaft which is fastened to the inner circumference of the spool holder, a holder fastening shaft made of an insulating material and fastened to the inner circumference of the holder shaft, and a motor that has an output shaft fastened to the holder fastening shaft, in which the holder shaft is fastened to an attachment plate of, for instance, the bonding apparatus via a conductive bearing so that the holder shaft is rotatable, and the conductive bearing is grounded.

4 Claims, 1 Drawing Sheet

SPOOL HOLDER STRUCTURE FOR A WIRE BONDER

BACKGROUND OF THE INVENTION

1. Field of the Invention

The present invention relates to a spool holder structure for a wire bonder which holds a spool around which a wire is wound.

2. Prior Art

Wire bonders form a ball by the discharge of a discharge electrode on the tip end of a wire that passes through a capillary. In this case, it is necessary that the initial end of the wire, which is wound on a spool, be grounded.

The structure described in Japanese Utility Model Registration No. 2550162 may be cited as a conventional example of a grounding structure for the initial end of a wire. This structure includes a contact plate which is fastened to a motor attachment plate so that the contact plate is pressed against the holder shaft of the spool holder by an elastic force. The contact plate has two contact parts, and one end of each contact part is a fixed part while the other end is free or not fixed. These two contact parts are formed so as to press against both side of the holder shaft so that the free ends of the contact parts are oriented in the direction of rotation of the holder shaft.

In the above-described prior art, the contact parts are pressed against the holder shaft by an elastic force. Accordingly, the portions of the contact parts that contact the holder shaft become worn by friction. Thus, there are problems in terms of durability.

BRIEF SUMMARY OF THE INVENTION

The object of the present invention is to provide a spool holder structure for a wire bonder that can extend the useful life of the spool holder structure.

The above object is accomplished by a unique structure of the present invention for a spool holder structure equipped with a spool holder that holds a spool around which a wire is wound, a holder fastening shaft consisting of an insulating material that is fastened to the inner circumference of the holder shaft of the spool holder, and a motor that has an output shaft fastened to the holder fastening shaft; and in the present invention, the holder shaft is rotatably supported via a conductive bearing that is fastened to an attachment plate, and the conductive bearing is grounded.

The above object is further accomplished by another unique structure of the present invention for a spool holder structure equipped with a spool holder that holds a spool around which a wire is wound, a holder fastening shaft consisting of an insulating material that is fastened to the inner circumference of the holder shaft of the spool holder, a motor that has an output shaft fastened to the holder fastening shaft, and an attachment plate to which the motor is mounted; and in the present invention, the inner race of a conductive bearing is fastened to the outer circumference of the holder shaft, the outer race of the conductive bearing is fastened to the attachment plate via a bearing holder, and the bearing holder is grounded.

In the above structures, it is preferable that the motor is grounded.

DETAILED DESCRIPTION OF THE INVENTION

Figure 1:
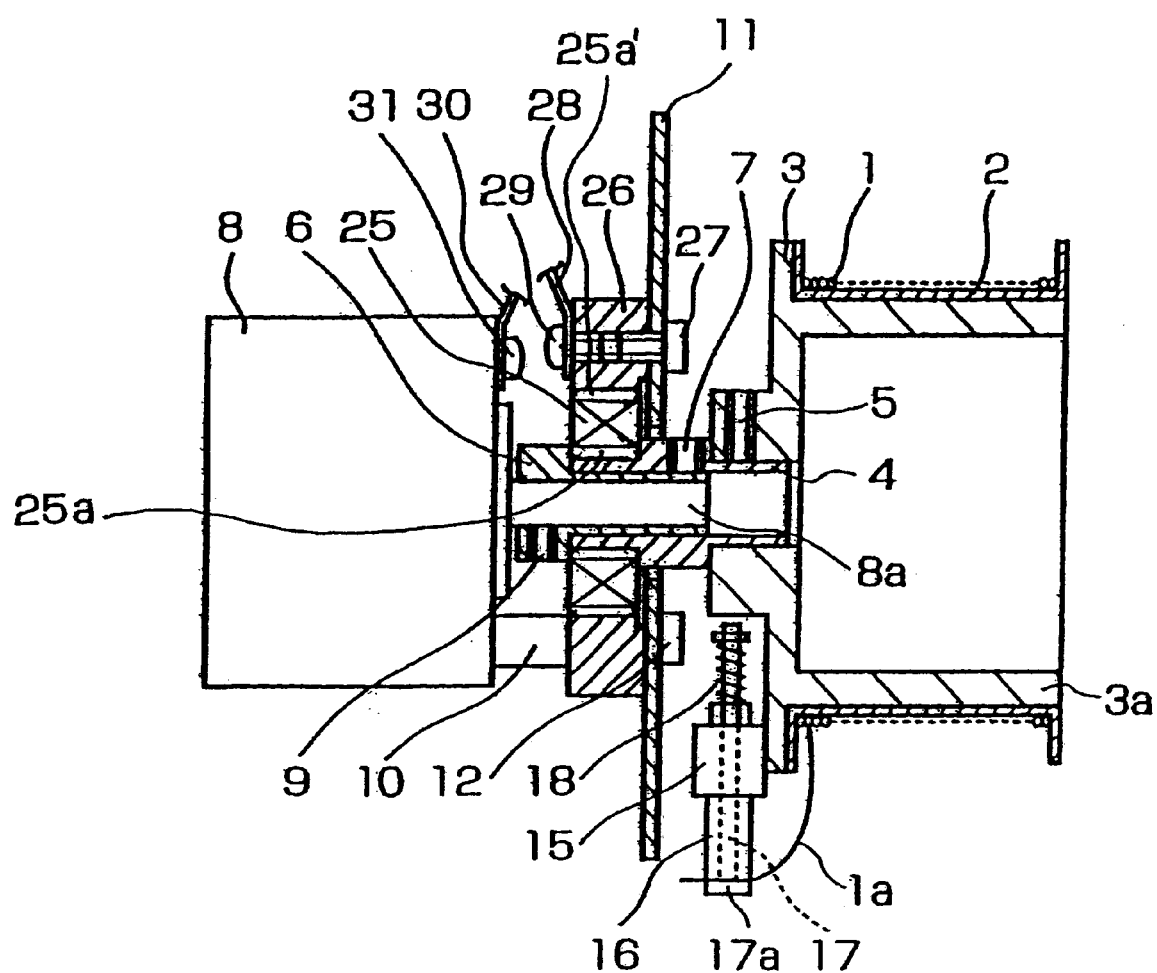
FIG. 1 is a partially sectional front view of one embodiment of the spool holder structure for a wire bonder according to the present invention.

In FIG. 1, a spool 2 on which a wire 1 is wound in multiple turns is mounted on the spool attachment part 3a of a spool holder 3 that consists of a conductive material. A holder shaft 4 that consists of a conductive material is fastened to the central part of the spool holder 3 by a screw 5. A holder fastening shaft 6 that consists of an insulating material is inserted into the space inside the inner circumference of the holder shaft 4, and this holder fastening shaft 6 is fastened to the holder shaft 4 by a screw 7. The output shaft 8a of a motor 8 is fastened to the holder fastening shaft 6 by a screw 9. The motor 8 is mounted on an attachment plate 11 (consisting of an insulating material) by a screw 12 via a supporting column 10. The attachment plate 11 is fastened to a fixing section (not shown) of a bonder or a wire bonding apparatus.

A wire initial end fastening holder 15 that consists of a conductive material is attached to the opposite surface of the spool holder 3 from the spool attachment part 3a. A fixed clamper 16 is fastened to the wire initial end fastening holder 15, and a movable clamper 17 is inserted into the fixed clamper 16 so that the movable clamper 17 is slidable. The movable clamper 17 has a clamping part 17a so as to face the end surface of the fixed clamper 16, and this clamping part 17a is urged by a spring 18 so that the clamping part 17a is pressed against the end surface of the fixed clamper 16. The structure described above is substantially the same as that of a conventional device.

Next, the structure that characterizes the present invention will be described.

A conductive bearing 25 (also called a "current-carrying bearing") is mounted on the holder shaft 4. The conductive bearing 25 is, at both ends of its inner race 25a, held by the holder shaft 4 and holder fastening shaft 6 so that the conductive bearing 25 is fastened to the holder shaft 4. The outer race 25a' of the conductive bearing 25 is fastened to a bearing holder 26, and this bearing holder 26 is fastened to the attachment plate 11 by a screw 27. An electrical connection terminal 28 is connected at one end thereof to the bearing holder 26 by a screw 29, and another end of this electrical connection terminal 28 is connected to the ground of a ball forming device (not shown); in other words, the terminal 28 is grounded.

A ground wire 30 is connected at one end thereof to the motor 8 by a screw 31, and another end of this ground wire 30 is connected to the wire bonding apparatus (not shown).

The operation will be described below.

The spool 2 is mounted on the spool attachment part 3a of the spool holder 3 so that the initial end 1a of the wire 1 is positioned in the vicinity of the clamping part 17a of the movable clamper 17. Then, the movable clamper 17 is pushed with the finger so that the clamping part 17a is separated from the end surface of the fixed clamper 16, and the initial end 1a of the wire 1 is placed against the end surface of the fixed clamper 16. When the movable clamper 17 is released, the movable clamper 17 is caused to return to its original position by the spring 18, and thus the initial end 1a of the wire 1 is held by the fixed clamper 16 and movable clamper 17. As a result, the wire 1 is electrically connected to the electrical connection terminal 28 via the fixed clamper 16, movable clamper 17, wire initial end fastening holder 15, spool holder 3, holder shaft 4, conductive bearing 25 and bearing holder 26, so that the wire 1 is grounded.

As seen from the above, the inner race 25a of the conductive bearing 25 is fastened to the outer circumference of the holder shaft 4, the outer race 25a' of the conductive bearing 25 is fastened to the attachment plate 11 via the bearing holder 26, and the bearing holder 26 is grounded. Accordingly, there are no parts that can be worn by friction as in conventional devices, and the useful life of constituting elements can be extended. Furthermore, since the ground (or earth ground) of the wire 1 is separated from the ground (earth ground) of the motor 8, noise emitted by the motor 8 can be eliminated.

In the above embodiment, the holder shaft 4 is a separate member from the spool holder 3. These elements, however, can be formed as a single integral member. Moreover, in the embodiment above, the initial end 1a of the wire 1 is clamped by the fixed clamper 16 and movable clamper 17. However, the initial end 1a of the wire 1 can be directly fastened to the spool holder 3.

As seen from the above, the present invention relates to a spool holder structure comprising a spool holder that holds a spool around which a wire is wound, a holder fastening shaft made of an insulating material that is fastened to the inner circumference of the holder shaft of the spool holder, and a motor that has an output shaft fastened to the holder fastening shaft; and in the present invention, the holder shaft is rotatably supported by a conductive bearing that is fastened to an attachment plate and is grounded. Accordingly, the spool holder structure of the present invention can provide an extended useful life.

What is claimed is:

1. A spool holder structure for a wire bonder, said spool holder structure comprising a spool holder that holds a spool around which a wire is wound, a holder fastening shaft which is made of an insulating material and is fastened to an inner circumference of a holder shaft of said spool holder, and a motor with an output shaft thereof being fastened to said holder fastening shaft, wherein said holder shaft is rotatably supported by a conductive bearing that is fasted to an attachment plate made of insulating material, and said bearing is grounded.

2. The spool holder structure for a wire bonder according to claim 1, wherein said motor is grounded.

3. A spool holder structure for a wire bonder, said spool holder structure comprising a spool holder that holds a spool around which a wire is wound, a holder fastening shaft which is made of an insulating material and is fastened to an inner circumference of a holder shaft of said spool holder, a motor with an output shaft thereof being fastened to said holder fastening shaft, and an attachment plate made of insulating material to which said motor is fastened, wherein said holder structure further comprises a conductive bearing and an inner race of said conductive bearing is fastened to an outer circumference of said holder shaft, an outer race of said conductive bearing is fastened to said attachment plate via a bearing holder, and said bearing holder is grounded.

4. The spool holder structure for a wire bonder according to claim 3, wherein said motor is grounded.

* * * * *